(12) United States Patent
Ghandi et al.

(10) Patent No.: US 10,608,079 B2
(45) Date of Patent: Mar. 31, 2020

(54) HIGH ENERGY ION IMPLANTATION FOR JUNCTION ISOLATION IN SILICON CARBIDE DEVICES

(71) Applicant: General Electric Company, Schenectady, NY (US)

(72) Inventors: Reza Ghandi, Niskayuna, NY (US); David Alan Lilienfeld, Niskayuna, NY (US); Alexander Viktorovich Bolotnikov, Niskayuna, NY (US); Peter Almern Losee, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 15/890,077

(22) Filed: Feb. 6, 2018

(65) Prior Publication Data
US 2019/0245035 A1   Aug. 8, 2019

(51) Int. Cl.
| | |
|---|---|
| *H01L 29/06* | (2006.01) |
| *H01L 29/16* | (2006.01) |
| *H01L 21/02* | (2006.01) |
| *H01L 27/092* | (2006.01) |
| *H01L 21/265* | (2006.01) |
| *H01L 21/324* | (2006.01) |
| *H01L 27/088* | (2006.01) |
| *H01L 21/761* | (2006.01) |

(Continued)

(52) U.S. Cl.
CPC .... *H01L 29/0646* (2013.01); *H01L 21/02529* (2013.01); *H01L 21/26506* (2013.01); *H01L 21/324* (2013.01); *H01L 21/761* (2013.01); *H01L 21/8213* (2013.01); *H01L 27/0605* (2013.01); *H01L 27/088* (2013.01); *H01L 27/092* (2013.01); *H01L 29/1608* (2013.01); *H01L 21/823481* (2013.01)

(58) Field of Classification Search
None
See application file for complete search history.

(56) References Cited

U.S. PATENT DOCUMENTS 4,063,966 A * 12/1977 Anthony .................. H01L 21/24
                                                    438/415
4,945,394 A    7/1990 Palmour et al.
(Continued)

OTHER PUBLICATIONS

Addamiano, Arrigo, et al.; "Ion Implantation Effects of Nitrogen, Boron, and Aluminum in Hexagonal Silicon Carbide", Journal of The Electrochemical Society, vol. 119, Issue: 10, pp. 1355-1362, 1972.

(Continued)

*Primary Examiner* — Lex H Malsawma
(74) *Attorney, Agent, or Firm* — Fletcher Yoder, P.C.

(57) ABSTRACT

An integrated circuit includes a silicon carbide (SiC) epitaxial layer disposed on a SiC layer, wherein the SiC epitaxial layer has a first conductivity-type and the SiC layer has a second conductivity-type that is opposite to the first conductivity-type. The integrated circuit also includes a junction isolation feature disposed in the SiC epitaxial layer and having the second conductivity-type. The junction isolation feature extends vertically through a thickness of the SiC epitaxial layer and contacts the SiC layer, and wherein the junction isolation feature has a depth of at least about 2 micrometers (μm).

26 Claims, 5 Drawing Sheets

(51) Int. Cl.
H01L 21/82 (2006.01)
H01L 27/06 (2006.01)
H01L 21/8234 (2006.01)

(56) References Cited

U.S. PATENT DOCUMENTS

| | | | | |
|---|---|---|---|---|
| 5,270,244 | A * | 12/1993 | Baliga | H01L 21/0445 |
| | | | | 148/DIG. 148 |
| 5,399,883 | A * | 3/1995 | Baliga | H01L 29/0891 |
| | | | | 257/493 |
| 5,449,925 | A * | 9/1995 | Baliga | H01L 29/1608 |
| | | | | 257/489 |
| 5,914,499 | A | 6/1999 | Hermansson et al. | |
| 6,936,505 | B2 | 8/2005 | Keys et al. | |
| 8,969,180 | B2 | 3/2015 | Nie et al. | |
| 9,006,080 | B2 | 4/2015 | Chou et al. | |
| 9,276,109 | B2 | 3/2016 | Rohrer | |
| 2001/0011729 | A1 * | 8/2001 | Singh | H01L 29/66068 |
| | | | | 257/77 |
| 2003/0075719 | A1 * | 4/2003 | Sriram | H01L 29/8128 |
| | | | | 257/77 |
| 2003/0183895 | A1 * | 10/2003 | Okamura | H01L 29/1608 |
| | | | | 257/454 |
| 2004/0099888 | A1 * | 5/2004 | Sriram | H01L 29/66068 |
| | | | | 257/288 |
| 2006/0118818 | A1 * | 6/2006 | Shimoida | H01L 29/0834 |
| | | | | 257/183 |
| 2006/0276014 | A1 | 12/2006 | Hsu et al. | |
| 2014/0361312 | A1 * | 12/2014 | Yoshikawa | H01L 29/41766 |
| | | | | 257/76 |

OTHER PUBLICATIONS

Poate, J.M., et al.; "Challenges for ion implantation", Extended Abstracts of the Second International Workshop on Junction Technology. IWJT. (IEEE Cat.No. 01EX541C), pp. 1-5, Tokyo, Nov. 29-30, 2001.

Alexandru, Mihaela, et al.; "Comparison between mesa isolation and p+ implantation isolation for 4H-SiC MESFET transistors", CAS 2011 Proceedings (2011 International Semiconductor Conference), pp. 317-320, Sinaia, Oct. 17-19, 2011.

* cited by examiner

HIGH ENERGY ION IMPLANTATION FOR JUNCTION ISOLATION IN SILICON CARBIDE DEVICES

BACKGROUND

The subject matter disclosed herein relates to silicon carbide integrated circuits.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) are widely used throughout modern electrical systems to transfer digital or analog signals, perform various functions, store information, and so forth. In general integrated circuits (ICs) include various interconnected semiconductor devices and components, such as resistors, capacitors, diodes, and various types of transistors (e.g., metal-oxide-semiconductor (MOS) transistor, complementary MOS (CMOS) transistor, metal-oxide-semiconductor field-effect transistor (MOSFETs), junction gate field-effect transistor (JFETs), insulated gate bipolar transistors (IGBTs), bipolar transistors (BJTs), and other suitable transistors).

Specifically for ICs utilizing wide bandgap semiconductors, such as silicon carbide (SiC), aluminum nitride (AlN), gallium nitride (GaN), etc., may afford a number of advantages in terms of high temperature operation, reduced off-state or standby power losses, and smaller die size than corresponding silicon (Si) devices. Accordingly, wide-bandgap semiconductor devices offer advantages to power conversion applications including, for example, power distribution systems (e.g., in electrical grids), power generation systems (e.g., in solar and wind converters), as well as consumer goods (e.g., electric vehicles, appliances, power supplies, etc.). However, the differences between SiC and Si material systems, for example, can cause certain material processing and structural features (e.g., device designs and/or manufacturing processes) that work well for Si devices to be unsuitable for corresponding SiC semiconductor devices, and vice versa. Accordingly, in addition to their benefits, wide-bandgap semiconductors materials also present challenges during device design and fabrication.

BRIEF DESCRIPTION

In an embodiment, an integrated circuit includes a silicon carbide (SiC) epitaxial layer disposed on a SiC layer, wherein the SiC epitaxial layer has a first conductivity-type and the SiC layer has a second conductivity-type that is opposite to the first conductivity-type. The integrated circuit also includes a junction isolation feature disposed in the SiC epitaxial layer and having the second conductivity-type. The junction isolation feature extends vertically through a thickness of the SiC epitaxial layer and contacts the SiC layer, and wherein the junction isolation feature has a depth of at least about 2 micrometers ($\mu$m).

In an embodiment, a method of manufacturing a semiconductor device includes providing a silicon carbide (SiC) epitaxial layer on top of an underlying SiC layer. The method includes fabricating features of adjacent planar devices in the SiC epitaxial layer, wherein the adjacent planar devices comprise transistors, resistors, capacitors, diodes, or a combination thereof, the SiC epitaxial layer is a first conductive type, and the underlying SiC layer is a second conductive type opposite to the first conductive type. The method includes forming a junction isolation feature between or around the adjacent planar devices by implanting dopants in the epitaxial SiC layer via high-energy ion implantation, wherein the junction isolation feature has a depth of at least about 2 micrometers ($\mu$m) such that the junction isolation feature extends vertically through a thickness of the epitaxial SiC layer and contacts or penetrates into the underlying SiC layer. The method also includes annealing the junction isolation feature.

In an embodiment, a silicon carbide (SiC) integrated circuit includes a SiC layer of a first conductive type and a SiC epitaxial layer of a second conductive type disposed on the SiC layer, wherein the second conductive type is opposite to the first conductive type. The SiC integrated circuit includes adjacent planar transistors, each includes a source contact and a drain contact disposed on the SiC epitaxial layer. The SiC integrated circuit also includes a junction isolation feature formed between or around the adjacent planar transistors. The junction isolation featured is doped with ions of the first conductive type at a concentration that is between about $1\times10^{14}$ ions per cubic centimeters (ions/$cm^3$) and about $1\times10^{18}$ ions/$cm^3$. The junction isolation has a width that is between about 1 micrometers ($\mu$m) and about 10 $\mu$m. Furthermore, the junction isolation feature extends vertically through a thickness of the SiC epitaxial layer and contacts the SiC layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
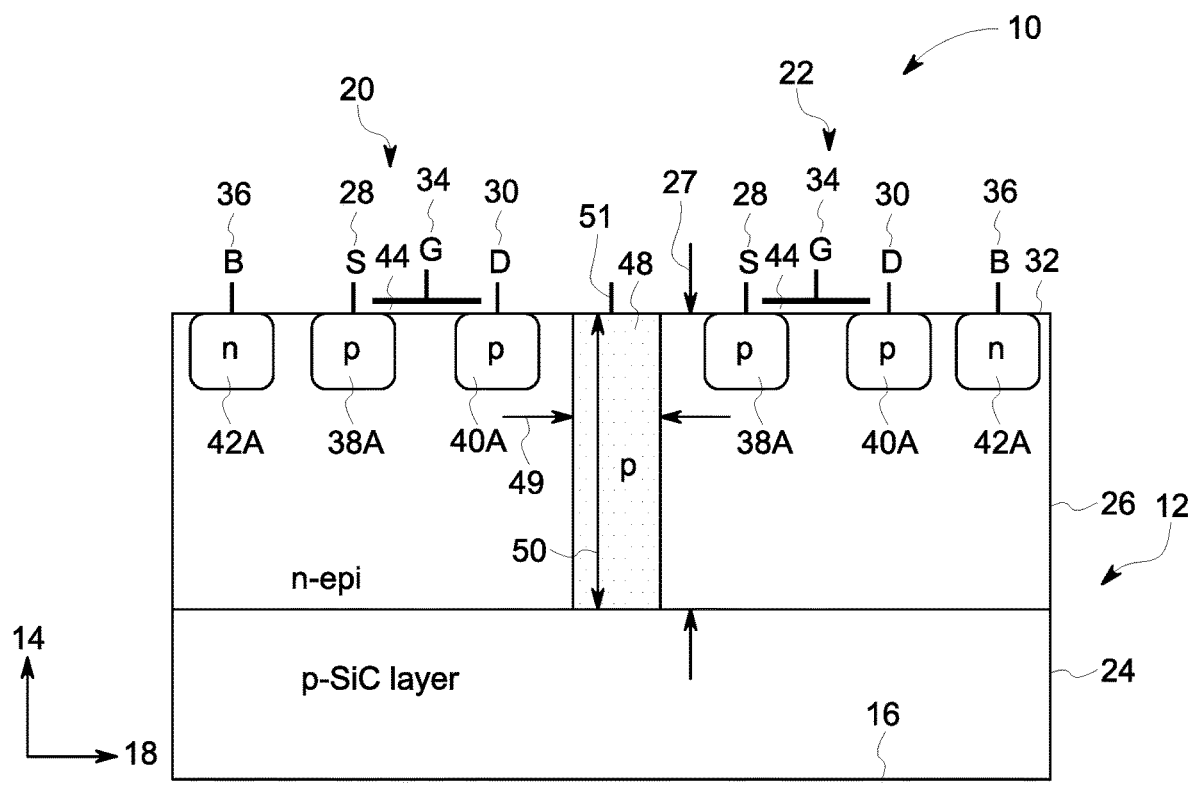
FIG. 1 is a cross-sectional view of a portion of SiC integrated circuit having an embodiment of a junction isolation feature disposed between portions of p-type MOS (PMOS) transistors in an n-type epitaxial layer, in accordance with the present technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. The term "substantially" as used herein to describe a shape, a position, or an alignment of a feature and is meant to encompass ideal or target shapes, positions, and alignments as well as imperfectly implemented shapes, positions, and alignments resulting from variability in the semiconductor fabrication process, as may be appreciated by one skilled in the art.

One of the essential building blocks of modern integrated circuits is the transistor, including the metal-oxide-semiconductor (MOS) transistor, the junction gate field-effect transistor (JFETs), the insulated gate bipolar transistors (IGBTs), bipolar junction transistors (BJTs), as well as others. For integrated circuits that are mostly based on planar or lateral transistors, it may be desirable to provide electrical isolation between adjacent transistors or group of transistors to avoid undesirable electrical connection. In Si material systems, electrical isolation features may be achieved using various approaches, including trench isolation and junction isolation. For trench isolation, a trench is formed between devices that is filled with a dielectric material. For junction isolation, dopants are introduced to form a p-n junction between devices to ensure electrical isolation. However, as set forth above, it is appreciated that SiC material systems are different from Si material systems, the electrical isolation approaches that work well for Si may not be well-suited for SiC. In particular, since suitable electrical isolation features cannot generally be fabricated using typical Si implantation equipment and implantation energies, trench isolation remains the standard approach for electrical isolation in SiC ICs.

With this in mind, present embodiments are directed toward SiC ICs having p-n junction isolation features that provide electrical isolation between adjacent transistors, as well as methods of fabrication of such SiC ICs. More specifically, present embodiments involve using high-energy ion implantation to form junction isolation features in the epitaxial layers of SiC ICs. The term "high-energy ion implantation," as used herein, refers to ion implantation in an energy range between about 100 kiloelectron volt (keV) and about 60 megaelectron volt (MeV). As discussed below, the present approach also involves a post-implantation annealing step to activate the implanted junction isolation feature and to remove defects in the SiC material, such as lattice damages in the implanted SiC epitaxial layer due to the high-energy implantation. As discussed below, the present approach can be used to fabricate junction isolation features to a depth of about 10 micrometers (μm) or more in an n-type or a p-type epitaxial layer of a SiC IC. The present electrical isolation technique may simplify an electrical isolation fabrication process by maintaining planarity throughout the fabrication process. Also, in comparison with trench isolation, junction isolation achieved via the present electrical isolation technique may be deeper and narrower (e.g., higher aspect ratio), and thus contributes to improving the packing density (e.g., number of transistors per area) of the SiC IC. Additionally, compared to trench isolation, the present electrical isolation technique can enable reductions in time and cost by reducing the number of steps to fabricate a SiC IC. For example, while a trench isolation feature is generally fabricated via at least three steps (e.g., forming the trench, filling the trench, and planarization), certain embodiments of the disclosed junction isolation feature may be fabricated via a single dopant implantation step.

With the foregoing in mind, FIGS. 1-4 illustrate cross-sectional views of example junction isolation features disposed between adjacent planar or lateral transistors in a SiC IC 10. As may be appreciated, the SiC IC 10 may be used in SiC power devices as well as any other suitable electronics and devices. In some embodiments, the SiC IC 10 may be configured to operate at temperatures above about 250 degrees Celsius (° C.). It may be appreciated that, in order to more clearly illustrate certain components of the SiC integrated circuit 10, certain commonly understood design elements (e.g., top metallization, passivation, edge termination, and so forth) are omitted from the drawings. It should also be appreciated that while, for simplicity, FIGS. 1-4 illustrate examples of a portion of SiC ICs 10 having a junction isolation feature electrically isolating two transistors for simplicity, the SiC ICs 10 may include junction isolation features disposed between any suitable devices (e.g., transistors, resistors, diodes, capacitors, or a combination thereof), where isolation is required. For example, the junction isolation may be around a device to electrically isolate the device from other devices. It should also be noted that while MOS transistors (e.g., PMOS, NMOS, CMOS) are illustrated in FIGS. 1-4, the SiC IC 10 may include any suitable planar or lateral transistors (e.g., MOSFET, DMOSFET, UMOSFET, VMOSFET, IGBT, IBMCT, JFET, MESFET, etc.), or any combination thereof, and may include junction isolation features to provide electrical isolation between particular adjacent transistors.

FIG. 1 is a cross-sectional view of an embodiment of a SiC IC 10. As shown, the SiC IC 10 may be described with reference to a planar or lateral direction 18 (e.g., parallel to a bottom surface 16 of the SiC layers 12) and a vertical direction 14 (e.g., perpendicular to the bottom surface 16 of the SiC layers 12). The integrated circuit 10 includes transistors 20 and 22, which are p-type MOS (PMOS) transistors that are disposed adjacent to one another along the lateral direction 18. In the illustrated embodiment, the SiC layers 12 include a SiC layer 24 and an epitaxial layer 26 disposed on top of the SiC layer 24. The epitaxial layer 26 is an epitaxial SiC layer, while the lower SiC layer 24 may be either a SiC substrate layer or an epitaxial SiC layer, in certain embodiments.

Each of the PMOS transistors 20 and 22 includes a terminal contact 28, such as a source contact and a terminal contact 30, such as a drain contact disposed over a top surface 32 of the epitaxial layer 26. The terminal contact 28 is disposed over a p-type source region 38A, while the terminal contact 30 is disposed over a p-type drain region 40A, at the top surface 32 of the epitaxial layer 26. Each of the transistors 20 and 22 also includes a gate 34 disposed above the top surface 32 of the epitaxial layer 26, between the terminal contacts 28 and 30. A dielectric layer 44 is situated between the gate 34 and the doped regions 38A and 40A to isolate the gate 34 from the doped regions 38A and 40A. Each of the transistors 20 and 22 also includes a terminal contact 36, such as a body contact disposed at the top surface 32 of the epitaxial layer 26. The terminal contact 36 is disposed over an n-type body region 42A of the epitaxial layer 26.

Additionally, the illustrated portion of SiC IC 10 includes a junction isolation feature 48 disposed between portions of the PMOS transistors 20 and 22 in the epitaxial layer 26. A high-energy implantation and annealing process may be used to fabricate the junction isolation feature 48, as discussed below with respect to FIG. 5. The junction isolation feature 48 has a conductivity-type that is opposite that of the epitaxial layer 26. For example, as illustrated in FIG. 1, the p-type junction isolation feature 48 is disposed in the n-type epitaxial layer 26. The junction isolation feature 48 is described herein as having a width 49 and a depth 50 as well as a doping profile. The junction isolation feature 48 has a suitable depth 50 to extend completely through the epitaxial layer 26 in the vertical direction 14 and contact the underlying SiC layer 24. For example, the depth 50 of the junction isolation feature 48 may be equal to or greater than a thickness 27 of the epitaxial layer 26. The doping profile of the junction isolation feature 48 is discussed in greater detail below, with respect to FIGS. 6 and 7.

During operation, an appropriate voltage (e.g., at or beyond a threshold voltage of the respective transistor) applied between the gate 34 and the terminal contact 36 may cause an inversion layer or a channel to form at the semiconductor-insulator interface. Furthermore, applying an appropriate voltage between the terminal contacts 28 and 30 may allow current to flow between the terminal contacts 28 and 30. It may be appreciated that due to the presence of the junction isolation feature 48, there is substantially no current flow through the epitaxial layer 26 between the terminal contacts (e.g., 38A, 40A, and 42A) of the adjacent PMOS transistors 20 and 22 of the SiC IC 10.

In some embodiments, there may be a bias contact 51 disposed on the junction isolation feature 48. The bias contact 51 may electrically couple the junction isolation feature 48 to any of the terminal contacts 28, 30, and 36 or another isolation feature 48. The junction isolation feature 48 may be biased via the current flow from the bias contact 51, leading to an enhanced electrical isolation effect of the junction isolation feature 48. In other embodiments, the bias contact 51 may be omitted.

Figure 2:
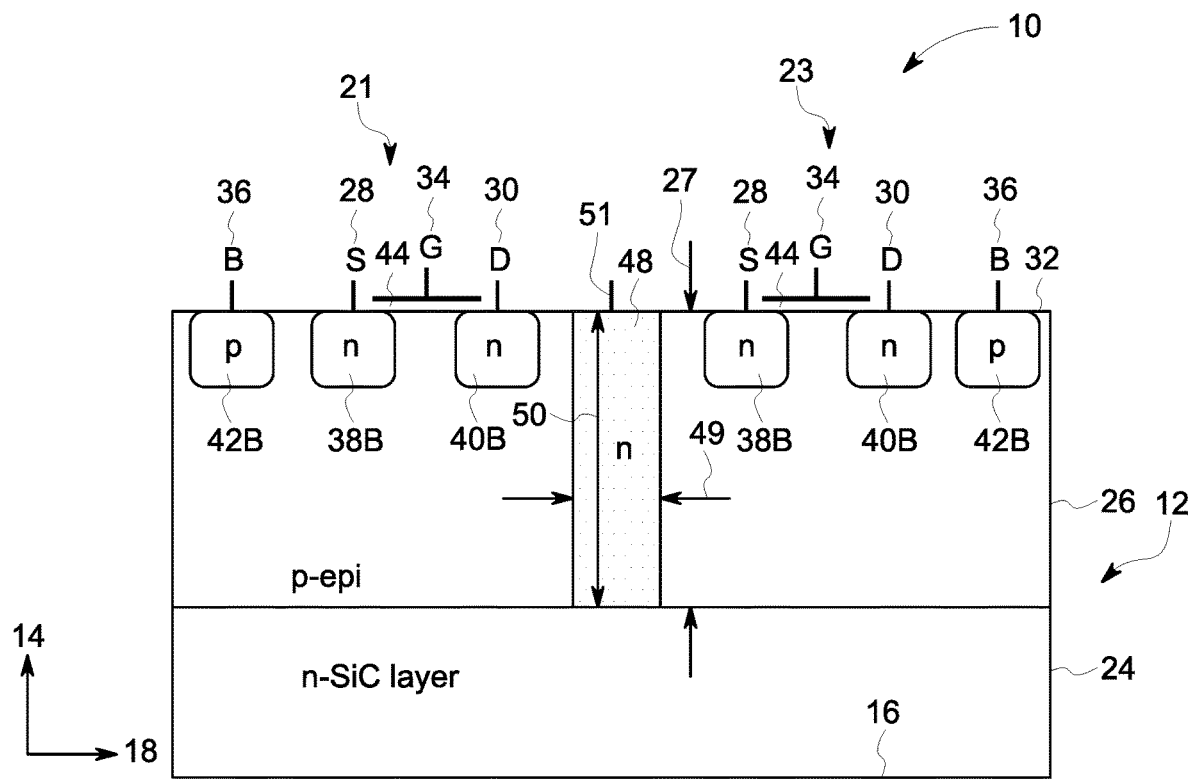
FIG. 2 is a cross-sectional view of a portion of SiC integrated circuit having an embodiment of the junction isolation feature disposed between portions of n-type MOS (NMOS) transistors in a p-type epitaxial layer, in accordance with the present technique.

In other embodiments, the SiC IC circuit 10 may include n-type MOS (NMOS) transistors 21 and 23, as shown in FIG. 2. The NMOS transistors 21 and 23 illustrated in FIG. 2 generally include similar features as the PMOS transistors 20 and 22, such as the epitaxial layer 26, the SiC layer 24, the source region 38, the drain region 40, and the body region 42, wherein the conductivity-type of the features are reversed relative to the PMOS transistors 20 and 22. For example, each of the NMOS transistors 21 and 23 may include an n-type source region 38B, an n-type drain region 40B, and a p-type body region 42B. Similar to the PMOS transistors 20 and 22 of FIG. 1, the NMOS transistors 21 and 23 illustrated in FIG. 2 are electrically isolated from one another by the n-type junction isolation feature 48, which extends completely through the p-type epitaxial layer 26 in the vertical direction 14 and contacts the underlying SiC layer 24 (e.g., the depth 50 of the junction isolation feature 48 may be equal to or greater than a thickness 27 of the epitaxial layer 26). In some embodiments, there may be the bias contact disposed on the junction isolation feature 48 as set forth above, and in other embodiments, the bias contact 51 may be omitted.

Figure 3:
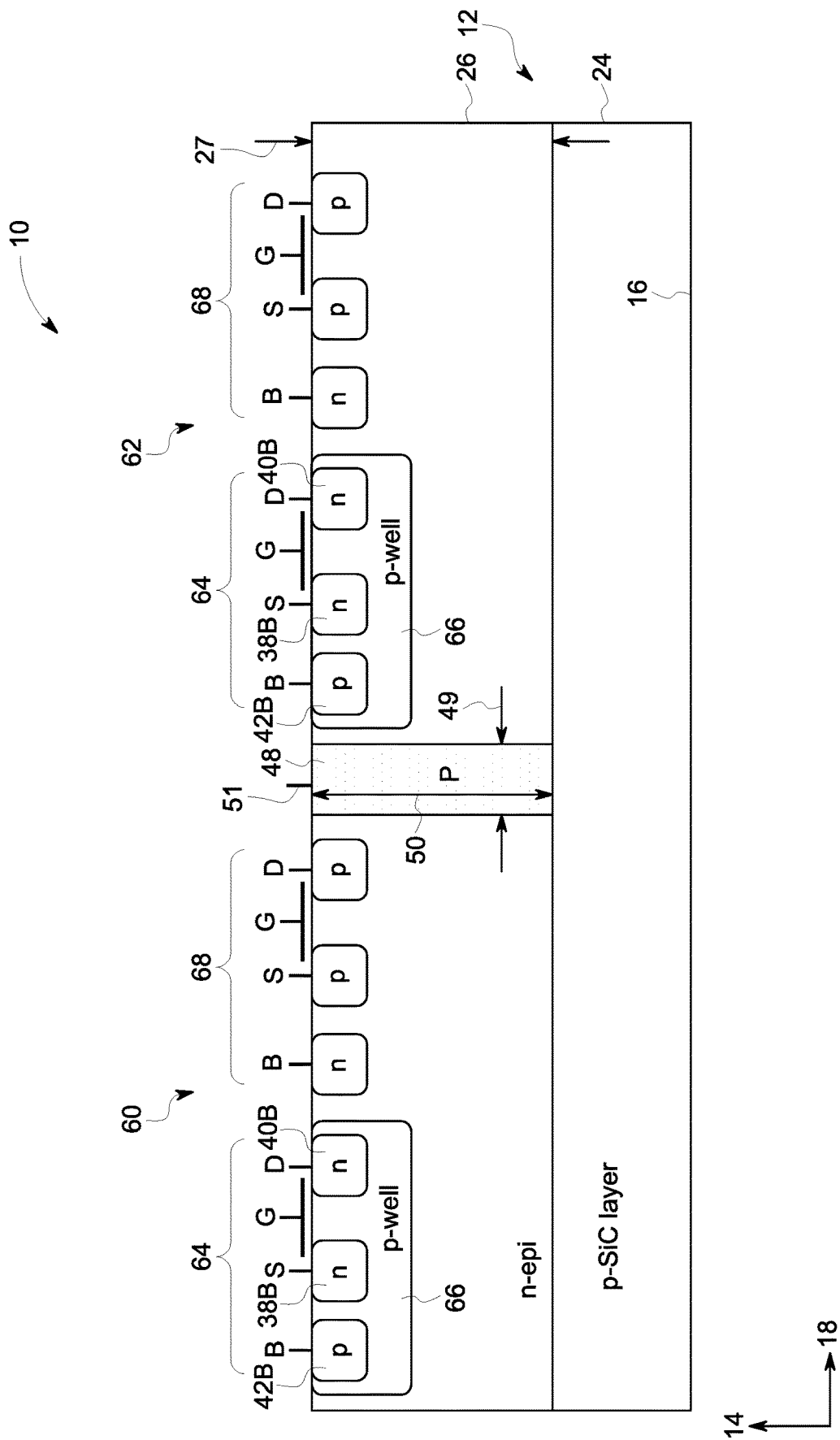
FIG. 3 is a cross-sectional view of a portion of SiC integrated circuit having an embodiment of the junction isolation feature disposed between CMOS transistors in an n-type epitaxial layer, in accordance with the present technique.

FIG. 3 is a cross-sectional view of another embodiment of a SiC integrated circuit 10 that includes the disclosed junction isolation feature 48. As shown, the SiC IC 10 may be described with reference to the planar or lateral direction 18 (e.g., parallel to the bottom surface 16 of the SiC layers 12) and the vertical direction 14 (e.g., perpendicular to the bottom surface 16 of the SiC layers 12). In the illustrated embodiment, the SiC layers 12 include the p-type SiC layer 24 and the n-type epitaxial layer 26.

The portion of the SiC integrated circuit 10 illustrated in FIG. 3 includes CMOS transistors 60 and 62 that are disposed adjacent to one another along the planar direction 18. Each of the CMOS transistors 60 and 62 includes a respective NMOS transistor 64 disposed adjacent to a respective PMOS transistor 68. The PMOS transistors 68 of FIG. 3 are substantially similar to the PMOS transistors 20 and 22 of FIG. 1. The NMOS transistors 64 are similar to the NMOS transistors 21 and 23 of FIG. 2, except that the p-type body region 42B, the n-type source region 38B, and the n-type drain region 40B of the NMOS transistors 64 are all disposed within p-type well regions 66.

Further, the CMOS transistors 60 and 62 illustrated in FIG. 3 are electrically isolated from one another by the junction isolation feature 48. As set forth above, the junction isolation feature 48 has an opposite conductive-type relative to the epitaxial layer 26. In the illustrated embodiment, the p-type junction isolation feature 48 is disposed within the n-type epitaxial layer 26. Additionally, the illustrated junction isolation feature 48 has a sufficient depth 50 to extend completely through the entire epitaxial layer 26 in the vertical direction 14 to contact the underlying SiC layer 24 (e.g., the depth 50 of the junction isolation feature 48 may be equal to or greater than a thickness 27 of the epitaxial layer 26). Due to the presence of the junction isolation feature 48, no substantial current can flow through the epitaxial layer 26 between the terminals of the adjacent CMOS transistors 60 and 62 (e.g., between the PMOS transistor 68 of the CMOS transistor 60 and the NMOS transistor 64 of the adjacent CMOS transistors 62). In some embodiments, there may be the bias contact 51 disposed on the junction isolation feature 48 as set forth above, and in other embodiments, the bias contact 51 may be omitted.

Figure 4:
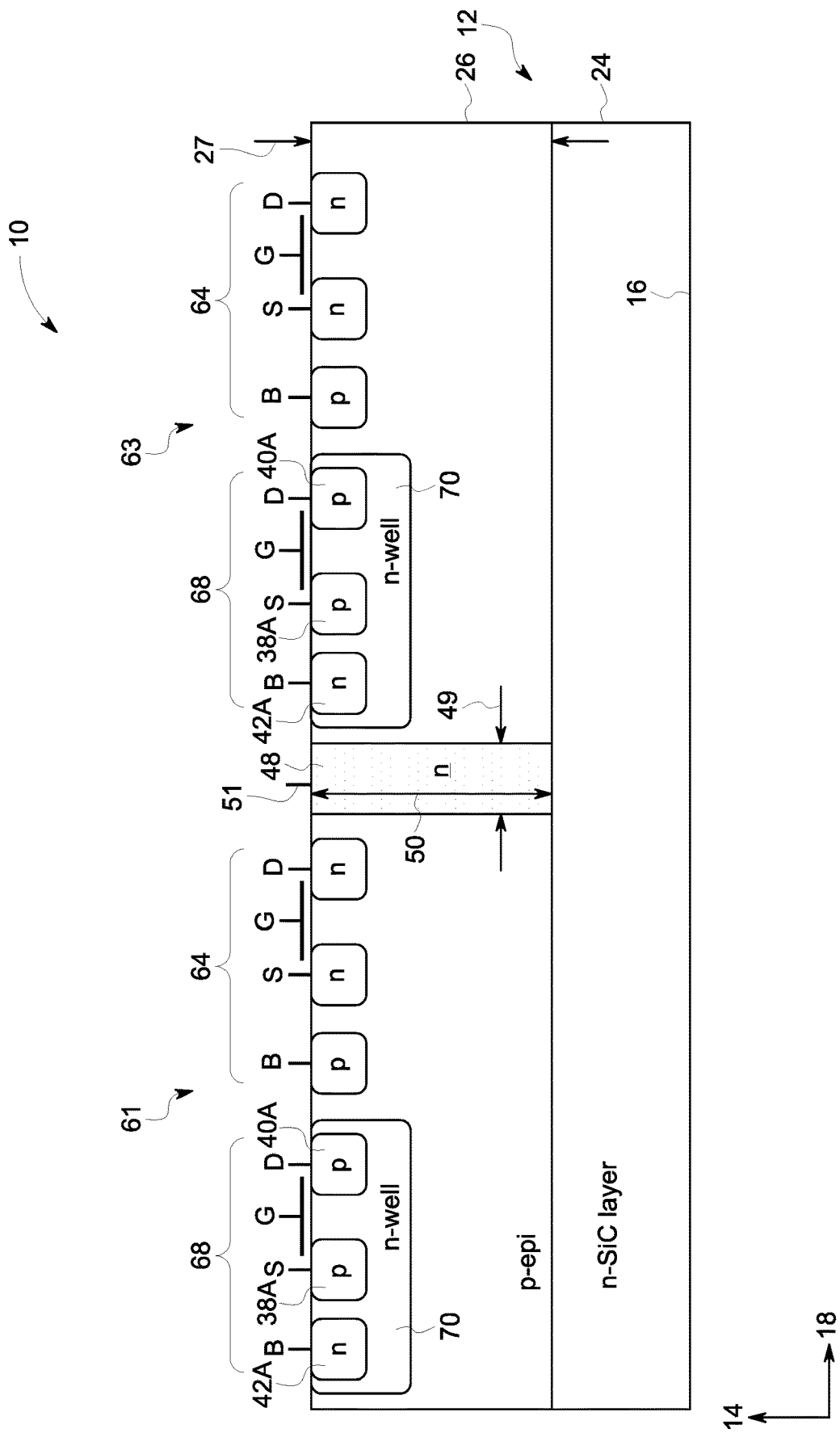
FIG. 4 is a cross-sectional view of a portion of SiC integrated circuit having an embodiment of the junction isolation feature disposed between CMOS transistors in a p-type epitaxial layer, in accordance with the present technique.

In other embodiments, the integrated circuit 10 may include CMOS transistors 61 and 63 that are disposed adjacent to one another along the planar direction 18, as shown in FIG. 4. The illustrated SiC layers 12 include the n-type SiC layer 24 and the p-type epitaxial layer 26. The SiC integrated circuit 10 illustrated in FIG. 4 includes CMOS transistors 61 and 63 that are disposed adjacent to one another along the planar direction 18. Each of the CMOS transistors 61 and 63 includes a respective NMOS transistor 64 disposed adjacent to a respective PMOS transistor 68. The NMOS transistors 64 of FIG. 4 are substantially similar to the NMOS transistors 21 and 23 of FIG. 2. The PMOS transistors 68 are similar to the PMOS transistors 20 and 22 of FIG. 1, except that the n-type body region 42A, the p-type source region 38A, and the p-type drain region 40A of the PMOS transistors 68 are all disposed within n-type well regions 70.

The transistors CMOS 61 and 63 are also electrically isolated from one another by the junction isolation feature 48. As set forth above, the junction isolation feature 48 extends completely through the epitaxial layer 26 in the vertical direction 14 to contact the underlying SiC layer 24 (e.g., the depth 50 of the junction isolation feature 48 may be equal to or greater than a thickness 27 of the epitaxial layer 26). In FIG. 4, the n-type junction isolation feature 48 is disposed within the p-type epitaxial layer 26. It may be appreciated that due to the presence of the junction isolation feature 48, no substantial current can flow through the epitaxial layer 26 between the terminals of the adjacent transistors between the adjacent CMOS transistors 61 and 63 (e.g., between the NMOS transistor 64 of the CMOS transistor 61 and the PMOS transistor 68 of the adjacent CMOS transistors 63). In some embodiments, there may be the bias contact 51 disposed on the junction isolation feature 48 as set forth above, and in other embodiments, the bias contact 51 may be omitted.

As discussed for the SiC ICs 10 shown in FIGS. 1-4, the junction isolation feature 48 has a sufficient doping and dimensions to ensure suitable electrical isolation between the respective planar devices (e.g., transistors in the illustrated embodiments). It should be noted that the planar devices discussed herein are not limited to the transistors illustrated in FIGS. 1-4, and the planar devices may include transistors, resistors, capacitors, diodes, or a combination thereof. Furthermore, the junction isolation feature 48 should be perceived as a three-dimensional feature that is between and/or around the planar devices where electrical isolation is desired. In particular, the depth 50 and/or the width 49 of the junction isolation feature 48 are sufficiently large to provide effective isolation. As set forth above, the junction isolation feature 48 extends completely through the epitaxial layer 26 in the vertical direction 14 and contacts the SiC layer 24 directly under the epitaxial layer 26 (e.g., the depth 50 of the junction isolation feature 48 may be equal to or greater than a thickness 27 of the epitaxial layer 26). In some embodiments, the depth 50 of the junction isolation feature 48 may be at least 2 µm. In some embodiments, the depth 50 of the junction feature 48 may be at least 3 µm. In some embodiments, the depth 50 of the junction isolation feature 48 may be about 10 µm. In some embodiments, the depth 50 of the junction isolation feature 48 may be between about 2 µm and about 10 µm, between about 3 µm and about 10 µm, or between about 4 µm and about 10 µm. In some embodiments, the depth 50 of the junction isolation feature 48 may be greater than 10 µm, such as between about 10 µm and 15 µm. In some embodiments, the width 49 of the junction isolation may be between about 1 µm and about 10 µm.

The junction isolation feature 48 may be doped with p-type dopants (e.g., aluminum, boron) when the epitaxial layer 26 is n-type and may be doped with n-type dopants (e.g., nitrogen, phosphorus) when the epitaxial layer 26 is p-type. The dopant concentration in the junction isolation feature 48 is at least equal to the dopant concentration in the epitaxial layer 26; however, the dopant concentration in the junction isolation feature 48 may be substantially greater than the dopant concentration in the epitaxial layer 26. For example, in some embodiments, the dopant concentration in the junction isolation feature 48 may between about twice (2×) and about ten times (10×) the dopant concentration in the epitaxial layer 26. In some embodiments, the dopant concentration in the junction isolation feature 48 may be greater than ten times (10×) the dopant concentration in the epitaxial layer 26, such as between about ten times (10×) and about fifteen times (15×), between about 15× and about a hundred times (100×) the dopant concentration of the epitaxial layer 26.

Figure 5:
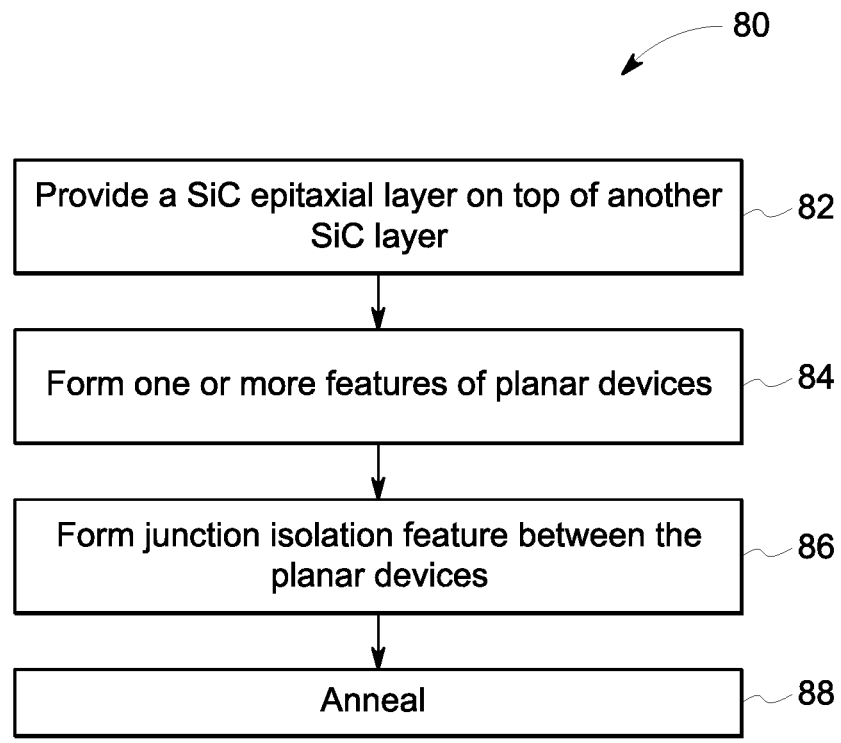
FIG. 5 is a flow chart illustrating an embodiment of a process for fabricating the junction isolation feature of SiC integrated circuit, in accordance with the present technique.

FIG. 5 is a flow chart illustrating an embodiment of a process 80 for fabricating a junction isolation feature in SiC IC 10, as illustrated in FIGS. 1-4. To facilitate discussion of aspects of the process 80 illustrated in FIG. 5, reference is made to the structures in FIGS. 1-4, which correspond to SiC integrated circuit or devices having planar devices (e.g., transistors, resistors, capacitors, diodes, or a combination thereof) isolated by the junction isolation feature 48 implanted via a high-energy implantation process. The process 80 begins with providing (block 82) a SiC epitaxial layer on top of another SiC layer. In particular, the SiC epitaxial layer is deposited above either a SiC substrate layer or another SiC epitaxial layer 24 to form the epitaxial layer 26 of the SiC IC 10. Subsequently, one or more features of the devices of the SiC IC 10 are formed (block 84) in the epitaxial layer 26. For example, this may include selective implanting the doped regions (e.g., the source regions 38A and 38B, the drain regions 40A and 40B, the body regions 42A and 42B) into the surface 32 of the epitaxial layer 26. In certain embodiments, other features of the SiC IC 10 may also be implanted while one or more of these regions are being formed. It may be appreciated that the actions of block 84 may include any suitable number of masking, aligning, and implanting steps.

The process 80 includes forming (block 86) the junction isolation feature 48 between the features of the planar devices of the SiC IC formed in block 84 using a high-energy implantation process. In particular, the junction isolation feature 48 is formed using a high-energy implantation process, in certain embodiments. It may be appreciated that a sufficiently thick mask layer is used during implantation to prevent dopants from entering regions adjacent to the junction isolation feature 48. The thickness of the mask layer may depend on the effectiveness or stopping power of the mask material, the implanted species, and the implantation energy used. In some embodiments, the thickness of the mask layer may be between about 1 µm and about 30 µm). The high-energy implantation may be performed using aluminum and/or boron dopants to form a p-type junction isolation feature, or performed using nitrogen and/or phosphorous dopants to form an n-type junction isolation feature 48. The high-energy implantation process may be performed using a relatively large implantation energy between about 2 MeV and about 60 MeV. In some embodiments, the high-energy implantation process may be greater than about 3 MeV (e.g., between about 3 MeV and about 60 MeV).

The high-energy implantation process of block 86 is performed with suitable dose to yield the junction isolation feature 48 having a dopant concentration that is equal to or greater than (e.g., twice to ten times) the dopant concentration in the epitaxial layer 26. In some embodiments, the high-energy implantation process may be performed with a suitable dose to yield a junction isolation feature 48 having a doping concentration between about $1 \times 10^{14}$ cm$^{-3}$ and about $1 \times 10^{18}$ cm$^{-3}$. The high-energy implantation process may be performed for a suitable duration and at suitable implantation energies to achieve a suitable implantation depth (e.g., the depth 50), such that the junction isolation feature 48 entirely penetrates the epitaxial layer 26 and contacts the SiC layer 24 directly below the epitaxial layer 26. For example, in certain embodiments, the high-energy implantation process may be performed for a suitable duration at the respective implantation energy, such that the depth 50 of the junction isolation feature 48 is greater than 2 μm. In certain embodiments, the high-energy implantation process may be performed for a suitable duration at the respective implantation energy, such that the junction isolation feature 48 is sufficiently deep (e.g., the depth 50 is between about 2 μm and about 10 μm, between about 3 μm and about 10 μm, between about 4 μm and about 10 μm, greater than about 10 μm, between about 10 μm and about 15 μm) and/or sufficiently wide (e.g., the width 49 of the junction isolation may be between about 1 μm and about 10 μm). It may be appreciated that although the parameters of the high-energy implantation process (e.g., implantation energy, duration, dopant dose, etc.) remain the same, the depth 50 of the junction isolation feature 48 may vary depending on the doping species. For example, in certain embodiments, when the high-energy implantation process is performed for a suitable duration at about 3 MeV, the junction isolation feature 48 having boron as dopants may have the depth 50 of about 3 μm to about 4 μm (e.g., about 3.8 μm), while the junction isolation feature 48 having aluminum as dopants may have the depth 50 of about 2.5 μm to about 3 μm (e.g., about 2.6 μm).

Figure 6:
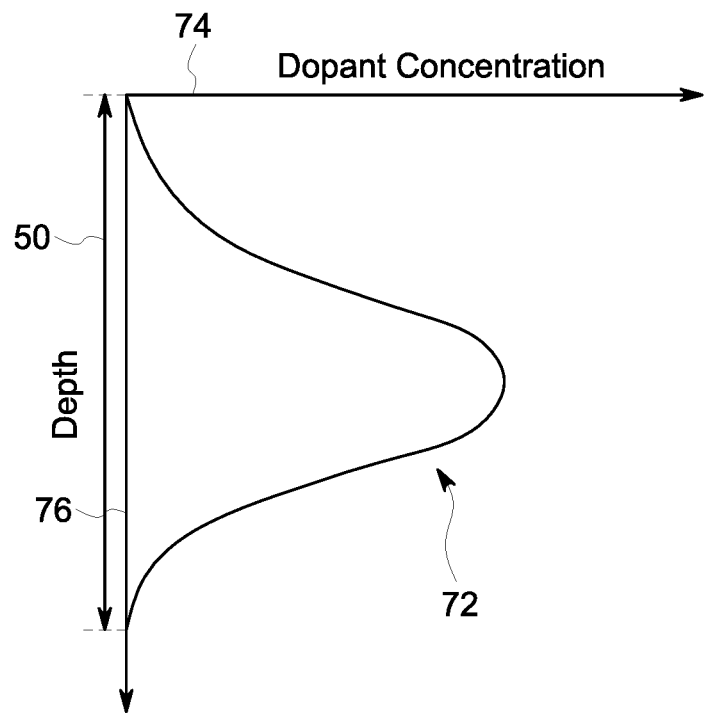
FIG. 6 is a graph illustrating a doping profile of an embodiment of the junction isolation feature that is implanted via single-energy implantation, in accordance with the present technique.

The high-energy implantation process of block 86 may be performed using a single-energy implantation process or a multi-energy implantation process (e.g., implantation via multiple doses distributed across different energies) to achieve a suitable doping profile in the junction isolation feature 48. FIG. 6 shows an example doping profile 72 of an embodiment of a junction isolation feature 48 formed using a single-energy implantation. In the illustrated embodiment, the doping profile 72 indicates dopant concentration 74 as a function of implantation depth 76. As shown, the doping profile 72 achieved via single-energy implantation is generally non-uniform. More specifically, the doping profile 72 demonstrates a bell-curve or Gaussian distribution in dopant concentration 74 with respect the depth 50 of the junction isolation feature 48.

Figure 7:
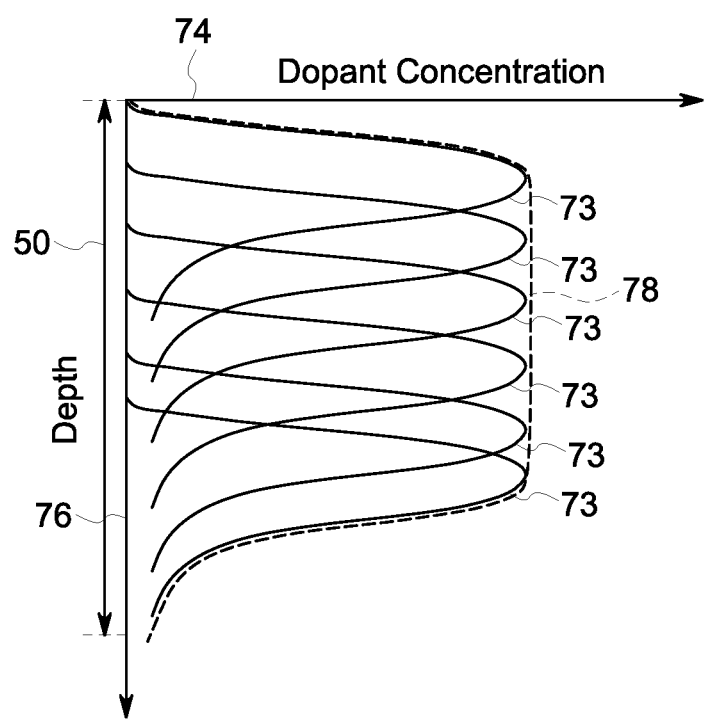
FIG. 7 is a graph illustrating a doping profile of another embodiment the junction isolation feature that is implanted via multi-energy implantation, in accordance with the present technique.

Accordingly, in some embodiments, the high-energy implantation process of block 86 may be performed using a multi-energy implantation process to achieve more uniformed dopant concentration with respect to the depth 50 of the junction isolation feature 48. FIG. 7 shows an example doping profile 78 of a junction isolation feature 48 formed using such a multi-energy implantation process. In the illustrated embodiment, the doping profile 78 is a total or an effective profile resulting from the combination of multiple doping profiles 73, each from a distinct single-energy implantation step of the overall multi-energy implantation process. As shown, the doping profile 78 may be substantially uniform with respect to the depth 50 of the junction isolation feature 48. In particular, the overall dopant concentration shown in doping profile 78 may be substantially constant throughout a substantial portion of depth 50 of the junction isolation feature 48. Furthermore, the multi-energy implantation process may be performed using the same or different dopant species, such that the junction isolation features 48 may include the same or different dopant species (e.g., aluminum and/or boron, nitrogen and/or phosphorous). In some embodiments, different dopant species may be used to achieve desired doping profile and/or depth (e.g., the depth 50). For example, for a p-type junction isolation feature 48, the multi-energy implantation process may be used to implant the relatively smaller boron dopants near the bottom (e.g., closer to the SiC layer 24) of the junction isolation feature 48 and implant the relatively larger aluminum dopants near the top portion (e.g., closer to the top surface 34) of the junction isolation feature 48.

It should be noted that in different embodiments, the junction isolation feature 48 may be formed prior to formation of the planar devices. In particular, the process set forth in block 86 may precede the process set forth in block 84. The integrated circuit fabrication process 80 also includes annealing (block 88) the SiC 10. After the junction isolation feature 48 is formed, the SiC integrated circuit 10 may be annealed at suitable temperatures for a suitable duration to activate the junction isolation (e.g., activate the electron/hole, provide impurities/species) and to remove defects in the SiC material, such as lattice damages resulting from the high-energy implantation process of block 86. In some embodiments, the annealing process may be performed at temperatures between about 1400 degrees Celsius (° C.) and about 2000° C. for a duration of about 10 minutes to about 60 minutes. It may be appreciated that, in certain embodiments, the annealing process may be performed at relatively higher temperatures for a relatively shorter duration, or at relatively lower temperatures for a relatively longer duration. It may also be appreciated that the anneal temperature may be held substantially constant or may vary during the annealing process, in different embodiments. It should be noted that because other doped/implanted regions (e.g., the source regions 38A and 38B, the drain regions 40A and 40B, the body regions 42A and 42B) may also be annealed, the annealing process set forth in block 88 may be performed to anneal both the junction isolation feature 48 and these other doped/implanted regions at the same time. In different embodiments, these doped/implanted regions may be annealed via a separate step, before or after the annealing process of the junction isolation feature 48. As such, these doped/implanted regions may be annealed at a different temperature and/or for a different duration (as compared to the temperature and duration for annealing the junction isolation feature 48).

The technical effects of the present disclosure include enabling effective electrical isolation in SiC ICs. The disclosed junction isolation features are formed using a high-energy implantation process followed by an annealing step. As such, the disclosed junction isolation features extend through even thick epitaxial layers (e.g., 10 μm or more) to reach the underlying SiC layer and electrically isolate the planar devices (e.g., transistors, resistors, capacitors, diodes, or a combination thereof) of the SiC IC. The disclosed junction isolation features are annealed to remove lattice damages in the implanted SiC epitaxial layer that result from the high-energy implantation. Additionally, compared to standard trench isolation techniques, the disclosed junction isolation features reduce the number of steps to fabricate a SiC IC.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An integrated circuit, comprising:
   a silicon carbide (SiC) epitaxial layer disposed on a SiC layer, wherein the SiC epitaxial layer has a first conductivity-type and the SiC layer has a second conductivity-type that is opposite to the first conductivity-type; and
   a junction isolation feature disposed in the SiC epitaxial layer and having the second conductivity-type, wherein the junction isolation feature extends vertically through a thickness of the SiC epitaxial layer and contacts the SiC layer, wherein the junction isolation feature has a depth of at least about 2 micrometers (μm), and wherein the junction isolation feature is positioned between adjacent planar transistors after fabrication.

2. The integrated circuit of claim 1, wherein the depth of the junction isolation feature is between about 3 μm and about 10 μm.

3. The integrated circuit of claim 1, wherein the junction isolation feature has a width between about 1 μm and about 10 μm.

4. The integrated circuit of claim 1, wherein the junction isolation feature is formed via high-energy ion implantation performed at ion implantation energies between about 2 megaelectron volts (MeV) and about 60 MeV.

5. The integrated circuit of claim 1, wherein the junction isolation feature is formed via multi-energy ion implantation.

6. The integrated circuit of claim 1, wherein the adjacent planar transistors comprise metal-oxide-semiconductor (MOS) transistors, complementary MOS (CMOS) transistors, metal-oxide-semiconductor field-effect transistors (MOSFETs), junction gate field-effect transistors (JFETs), insulated gate bipolar transistors (IGBTs), or a combination thereof.

7. The integrated circuit of claim 1, wherein the junction isolation feature has a dopant concentration between about $1\times10^{14}$ per cubic centimeters (cm$^{-3}$) and about $1\times10^{18}$ cm$^{-3}$ of the second conductivity-type.

8. The integrated circuit of claim 1, wherein the junction isolation feature has a dopant concentration that is at least four times a dopant concentration of the SiC epitaxial layer.

9. The integrated circuit of claim 1, wherein the first conductivity-type is n-type and the junction isolation feature is doped with aluminum, boron, or both.

10. The integrated circuit of claim 1, wherein the first conductivity-type is p-type and the junction isolation feature is doped with nitrogen, phosphorous, or both.

11. The integrated circuit of claim 1, wherein the integrated circuit is part of a power conversion device of a power conversion system.

12. The integrated circuit of claim 1, wherein the junction isolation feature is disposed around each transistor of the adjacent planar transistors.

13. A method of manufacturing a semiconductor device, comprising:
   providing a silicon carbide (SiC) epitaxial layer on top of an underlying SiC layer;
   fabricating features of adjacent planar devices in the SiC epitaxial layer, wherein the adjacent planar devices comprise transistors, resistors, capacitors, diodes, or a combination thereof, the SiC epitaxial layer is a first conductive type, and the underlying SiC layer is a second conductive type opposite to the first conductive type;
   forming a junction isolation feature between the adjacent planar devices by implanting dopants in the SiC epitaxial layer via high-energy ion implantation, wherein the junction isolation feature has a depth of at least about 2 micrometers (μm) such that the junction isolation feature extends vertically through a thickness of the SiC epitaxial layer and contacts or penetrates into the underlying SiC layer; and
   annealing the junction isolation feature.

14. The method of claim 13, wherein annealing the junction isolation feature comprises annealing the junction isolation feature before, after, or at the same time as annealing the adjacent planar devices.

15. The method of claim 13, wherein forming the junction isolation feature comprises performing the high-energy ion implantation at implantation energies between about 2 megaelectron volts (MeV) and about 60 MeV.

16. The method of claim 13, wherein forming the junction isolation feature comprises performing multi-energy ion implantation.

17. The method of claim 13, wherein forming the junction isolation feature comprises implanting aluminum ions, boron ions, or both, when the first conductive type is n-type.

18. The method of claim 13, wherein forming the junction isolation feature comprises implanting nitrogen ions, phosphorous ions, or both when the first conductive type is p-type.

19. The method of claim 13, wherein forming the junction isolation feature comprises implanting the dopants in the SiC epitaxial layer with a dopant concentration between about $1\times10^{14}$ ions per cubic centimeters (ions/cm$^3$) and about $1\times10^{18}$ ions/cm$^3$.

20. The method of claim 13, wherein annealing the semiconductor device is performed at temperatures between about 1400 degrees Celsius (° C.) and about 2000° C. for a duration of about 10 minutes to about 60 minutes.

21. The method of claim 13, comprising forming a bias contact on top of the junction isolation feature, wherein the bias contact electrically couples the junction isolation feature to one or more terminal contacts of the adjacent planar devices.

22. A silicon carbide (SiC) integrated circuit comprising:
   a SiC layer of a first conductive type;
   a SiC epitaxial layer of a second conductive type disposed on the SiC layer, wherein the second conductive type is opposite to the first conductive type;
   adjacent planar transistors, each comprising a source contact and a drain contact disposed on the SiC epitaxial layer; and
   a junction isolation feature doped with ions of the first conductive type at a concentration that is between about $1\times10^{14}$ ions per cubic centimeters (ions/cm3) and about $1\times10^{18}$ ions/cm3, wherein the junction isolation feature has a width that is between about 1 micrometers (μm) and about 10 μm, wherein the junction isolation feature extends vertically through a thickness of the SiC epitaxial layer and contacts the SiC layer, and wherein the junction isolation feature is positioned between the adjacent planar transistors after fabrication.

23. The SiC integrated circuit of claim 22, wherein the thickness of the SiC epitaxial layer is at least about 2 micrometers (μm).

24. The SiC integrated circuit of claim 22, wherein the SiC integrated circuit is configured to operate at temperatures above about 250 degrees Celsius.

25. The SiC integrated circuit of claim 22, wherein the junction isolation feature is formed via multi-energy ion implantation at implantation energies between about 2 megaelectron volts (MeV) and about 60 MeV.

26. The SiC integrated circuit of claim 22, wherein the SiC integrated circuit is annealed at temperatures between about 1400 degrees Celsius (° C.) and about 2000° C. for a duration of about 10 minutes to about 60 minutes.

\* \* \* \* \*